INVENTOR.
Hilmer I. Swanson

BY Hill, Sherman, Meroni, Gross & Simpson
ATTORNEYS

April 14, 1970 H. I. SWANSON 3,506,920

HIGH EFFICIENCY TRANSFORMER UTILIZING PULSE DURATION MODULATION TO ELIMINATE AUDIO-RF TRANSFORMER COUPLING

Filed Feb. 10, 1966 2 Sheets-Sheet 2

INVENTOR.
Hilmer I. Swanson

BY [illegible] ATTORNEYS 3,506,920

HIGH EFFICIENCY TRANSFORMER UTILIZING PULSE DURATION MODULATION TO ELIMINATE AUDIO-RF TRANSFORMER COUPLING

Hilmer I. Swanson, Quincy, Ill., assignor to Gates Radio Company, Quincy, Ill., a corporation of Illinois Filed Feb. 10, 1966, Ser. No. 526,610
Int. Cl. H04b *1/04*
U.S. Cl. 325—142 15 Claims

ABSTRACT OF THE DISCLOSURE

A high efficiency transmitter having a pulse duration modulator coupled to an input audio source and including a power amplifier coupled to the output of the pulse duration modulator for increasing the amplitude of the information pulses. Demodulation means for the pulse duration modulated signal is coupled through a DC path from the power amplifier directly to the RF stage, thereby eliminating the need for an inefficient audio-RF coupling transformer.

This invention relates to a high efficiency transmitter and in particular to a transmitter having a novel modulation system for increasing the efficiency of amplifier stages and for eliminating the need for a coupling transformer between the audio and radio frequency stages.

High frequency transmitters such as found in radio or television transmitting systems characteristically employ audio and radio frequency stages wherein the audio input signal is amplified and applied to the radio frequency stage for modulating a high frequency radio carrier. Amplification of the input audio signal is required in order to increase the power necessary to modulate the high powered carrier signal at the output or antenna stages.

Radio transmitters having varying power ratings, such as from 500 watts to 200 kilowatts, generally use high powered amplifier tubes in the final amplification stages. In the operation of such tubes, however, appreciable power loss can be expected from direct amplification of the audio signal. This power loss is due to the internal characteristics of the tube itself.

Generally such amplifier tubes have maximum power loss within the operating range. This occurs when a high voltage exists across the tube and a high current exists through the tube. In contrast, when the current within the tube is maximized the voltage across the tube is at a minimum and the power loss is substantially zero. Also, when zero current exists within the tube, the voltage is a maximum and the power loss is zero. It is apparent, then, that if the high powered amplifier tubes could be caused to operate only in the vicinities of maximum or minimum current, the operation efficiency could be greatly increased.

To further complicate the problem of power loss in the audio amplifier stages, DC power from the RF stage tends to appreciably decrease the efficiency of amplifier tubes. Also DC signals from the RF stages tend to produce distortion making the operation of the amplifier stages undesirable. Accordingly, it has become necessary to use a coupling transformer between the audio amplifier stages and the RF modulation stage.

The coupling transformer serves to isolate the radio frequency signals from the audio amplifier stage and to increase the efficiency of the audio amplifier stage to a workable level. The coupling transformer, however, can be a sizable device for the high powered transmitter as characterized in this invention. For instance, a coupling transformer for a 50 kw. transmitter costs approximately $5,000. In addition, such a transformer weighs approximately 6,000 pounds which may be as much as one-third of the total weight of the transmitter system. It is apparent that the elimination of the coupling transformer from such transmitter devices would appreciably decrease the cost of transmitter systems and increase the availability of higher powered systems for more mobile type uses such as may be required for military or scientific endeavors.

Accordingly, it is a principal object of this invention to provide a novel high efficiency radio frequency transmitter.

It is also an object of this invention to provide a high frequency transmitter having an audio and a high frequency stage wherein an amplifier device in the audio stage operates only at points of high and low current values.

It is an other object of this invention to provide a radio frequency transmitter which directly couples the audio amplifier stage to the radio frequency modulator stage and which thereby eliminates the expensive and weighty coupling transformer.

It is a further object of this invention to provide a radio frequency transmitter having a pulse duration modulator system for modulating an audio input and having an amplifier stage for increasing the level of the resulting modulation pulse train and for directly connecting the modulated audio signal through a demodulation device to a radio frequency modulation stage.

It is also an object of this invention to provide a radio frequency radio transmitter having audio amplifier stages connected directly to the radio frequency modulation stages and having a pulse duration modulation system for modulating an audio input signal and employing an amplitude modulation device for amplitude modulating the pulse modulated audio input.

It is an additional object of this invention to provide a radio frequency transmitter having a pulse duration modulation system which utilizes a modified triangular waveshape for triggering a modulated audio pulse train wherein the modified triangular waveform is developed by adding a square wave signal to a substantially triangular waveform.

It is another object of the invention to provide a radio frequency, high powered radio transmitter having a pulse duration modulation system for increasing the efficiency of an audio amplifier wherein the pulse modulated audio signal is further amplitude modulated to compensate for stray capacitance effects on certain modulation pulses at the high powered amplifier stage.

It is another object of this invention to provide an RF transmitter having a low pass filter connected to the plate circuit of a pulse amplifier device for amplitude modulating a pulsed modulated audio signal to compensate for the increasing of pulse sizes at the power amplifier stages due to stray capacitance between the plate and cathode circuits of the power amplifier device.

These and other objects, features and advantages of the present invention will be understood in greater detail from the following description and the associated drawings wherein reference numerals are utilized in designating an illustrative embodiment and wherein.

Figure 1:
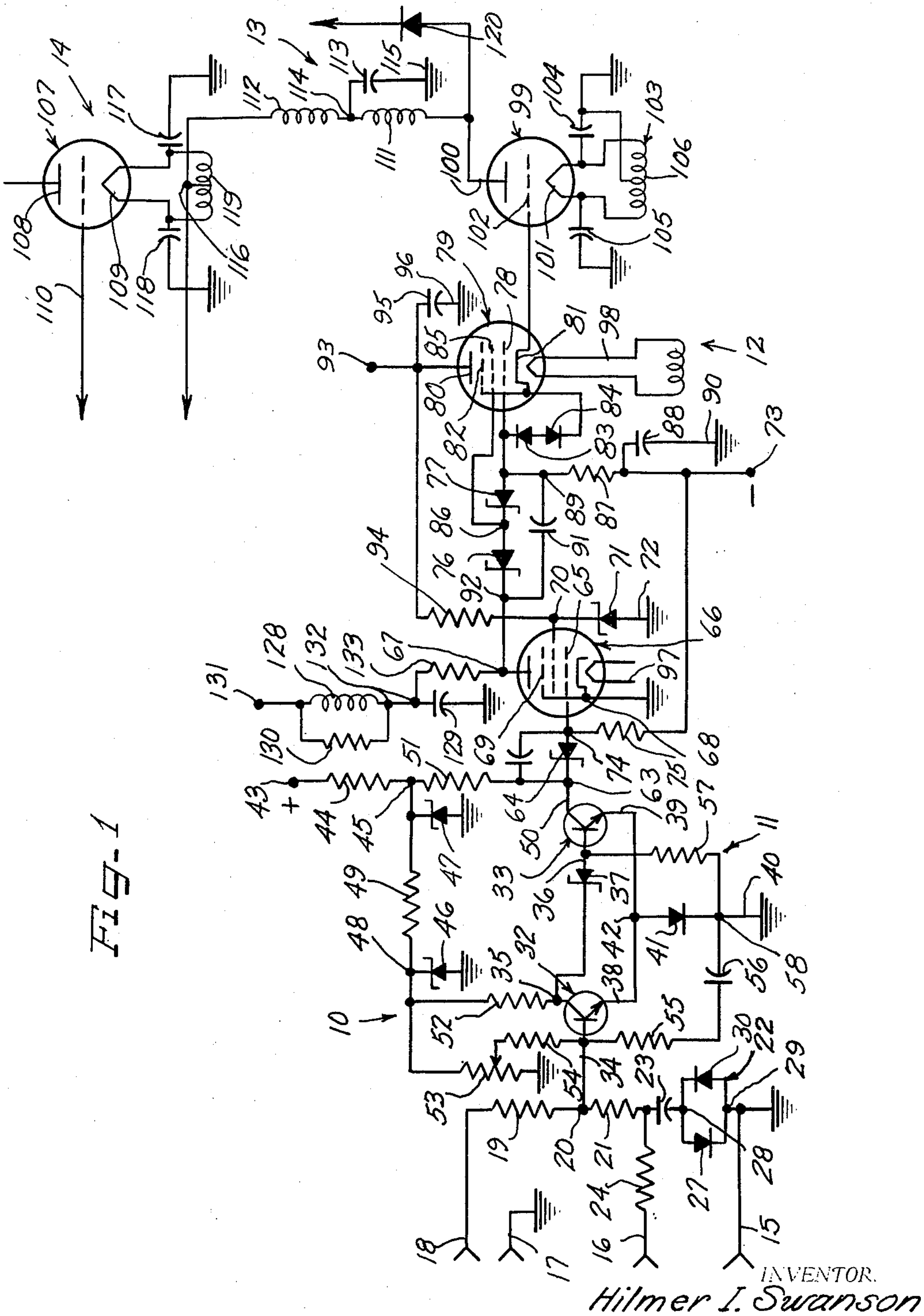
FIGURE 1 is a schematic view of a high frequency, high powered transmitter having the objects and features of this invention.

Generally this invention concerns a radio frequency transmitter which has an entirely novel approach for increasing the efficiency of a power amplifier stage. In addition to increasing the efficiency of the amplifier stages, this invention also greatly reduces the cost of the transmitter as well as the size and weight of the transmitter assembly.

Since the efficiency of an amplifier device is maximized at points of maximum current or minimum current, this invention employs a means for amplifying an audio signal only at the respective points of maximum efficiency. This is accomplished by pulse duration modulating the audio signal and amplifying the resulting pulse train, rather than amplifying the audio signal itself. In this way the final amplification or power amplifier stages can be caused to operate only in either an *on* or *off* state, that is, at points of maximum or minimum current. The pulse train received at the grid of the amplifier device will turn the device to either an *on* or *off* state, avoiding thereby the intermediate inefficient operation levels.

By pulse modulating the audio input signal and amplifying the pulse train rather than amplifying the audio signal itself, further efficiencies can be accomplished. In particular, because the amplifier device is required only to operate in an *on* or *off* position, DC power from the RF stage is not a problem in the operation of the audio amplifier. Accordingly, the output on the amplifier stage may be connected directly to the radio frequency stage thereby eliminating the need for an expensive and weighty coupling transformer.

Referring to the drawings in greater detail, the high efficiency transmitter of the invention is referred to generally by the reference numeral 10 and consists of a pulse modulation stage 11, an amplification stage 12, a domodulation stage 13 and a radio frequency stage 14.

Figure 3:
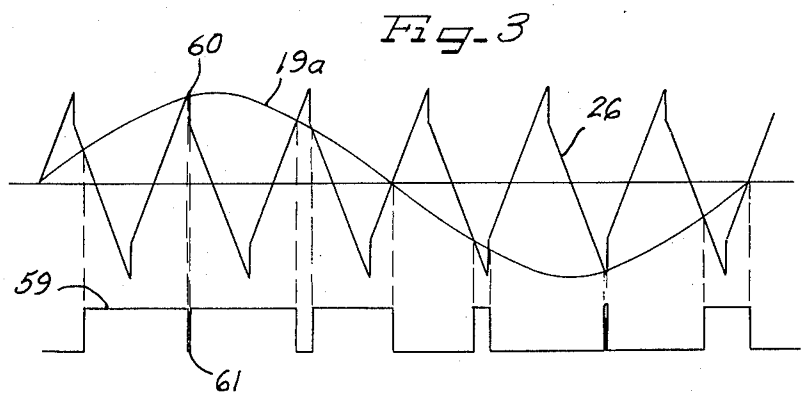
FIGURE 3 is a diagrammatic view similar to FIGURE 2 showing the combination of an audio and trigger signal and the resulting pulse modulated audio signal.

The modulation section 11 has two sets of input terminals 15–16 and 17–18. The audio signal, as may be represented by the sinusoidal wave 19*a* shown in FIGURE 3, is applied across the terminals 17 and 18 and is received through resistor 19 to a junction point 20. A square wave voltage signal used ultimately for triggering the pulse modulator 11 is applied across the terminals 15 and 16 and is received in a modified form through a resistor 21 at the junction point 20.

The square wave signal applied at the terminals 15 and 16 is modified through a parallel diode circuit 22 and a series connected capacitor 23. The combination of the capacitor and the parallel diode circuit is connected directly across the input signal at the terminals 15 and 16 through a resistor 24.

Figure 2:
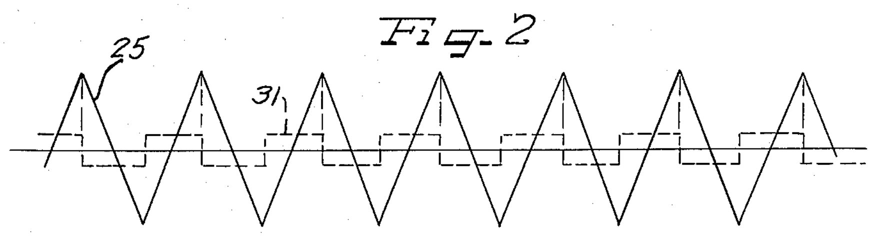
FIGURE 2 is a diagrammatic illustration showing a triangular and square wave input for triggering a pulse modulation device of the transmitter shown in FIGURE 1.

As is understood, the square wave current signal applied at the terminals 15 and 16 is integrated through the capacitor 23 resulting in a triangular voltage waveform 25 as shown in FIGURE 2. However, the presence of the parallel diode combination alters the triangular waveform 25 into the modified waveform 26 shown in FIGURE 3.

The parallel diode combination 22 consists of diode 27 having an emitter terminal connected at the junction point 28 and a collector terminal connected at the junction point 29. The other diode 30 has its collector terminal connected at the junction point 28 and its emitter terminal connected at the junction point 29. The result is that the voltage developed between the terminals 28 and 29 of the parallel combination 22 is essentially a square wave 31 as shown in FIGURE 2. When added to the triangular wave 25, a modified trigger voltage signal 26 is developed which achieves certain favorable results when applied to the junction point 21.

The pulse modulation circuit 11 comprises first and second transistors 32 and 33. The transistor 32 has a base 34 connected directly to the junction point 20 and has a collector 35 connected to the base 36 of the transistor 33. A Zener diode 37 is serially connected between the collector 35 and the base 36 to provide a bias triggering level for the transistor 33. Also the transistors 32 and 33 have emitters 38 and 39 respectively, connected to ground as at the point 40 through a diode 41 conducting from a junction point 42.

The transistors 32 and 33 have their collectors maintained at a designated bias voltage level through a DC voltage supply applied at the terminal 43 through a resistor 44, to a junction point 45. The specific levels of biasing values applied to the respective collectors of the given transistors are determined by Zener diodes 46 and 47. The Zener diode 47 is connected to ground from the junction point 45 and the diode 46 is connected from the point 48 which is separated from the point 45 by a resistor 49. The junction point 45 is connected to the collector 50 of the transistor 33 through a resistor 51, while the junction point 48 is connected to the collector 35 of the transistor 32 through a resistor 52. The junction point 48 is further connected to the base 36 of the transistor 33 through a circuit branch comprising a variable resistor 53, series resistors 54 and 55, a capacitor 56 and a further resistor 57. A point 58 intermediate the capacitor 56 and the resistor 57 is grounded as at the point 40.

When both the transistors 32 and 33 are in an *off* condition, a given positive voltage level as determined by the diodes 46 and 47 is applied to the collectors 35 and 50 of the transistors 32 and 33, respectively.

Should the junction point 20 become positive, the transistor 32 will be placed in a conducting state and current will exit from the junction point 48 through the transistor 32 to ground at the point 40. The effect is that the collector 35 of the transistor 32 will be suddenly reduced in voltage due to the voltage drop across the resistor 52. Also, current will exist within the diode 37 resulting in an additional voltage drop from the collector 35 to the base 36 of the transistor 33. Accordingly, an *on* condition for the transistor 32 results in an *off* condition for the transistor 33.

However, should the base 34 of the transistor 32 become sufficiently negative, the transistor 32 would be placed in an *off* condition which would greatly reduce the current within the transistor 32 and within the Zener diode 37, thereby significantly increasing the voltage at the base 36 of the transistor 33. This means that an *off* condition for the transistor 32 corresponds to an *on* condition for the transistor 33.

The pulse modulation of the input audio signal is accomplished as shown in FIGURE 3. In particular, whenever the audio signal 19 exceeds the value of the modified triangular input wave 26, the base 34 of the transistor 32 is biased into an *off* condition. Accordingly, the transistor 33 is biased into an *on* condition. The voltage from the voltage source 43 drives the transistor 33 into saturation and develops a constant level voltage output as at 59 in FIGURE 3. However, should the triangular waveform 26 exceed the audio signal 19 as at the point 60, the transistor 32 would be driven into an *on* condition, and the transistor 33 would be reverse biased. Accordingly, the transistor 33 will be non-conducting resulting in a voltage output level as at 61. Therefore, depending upon the relative level of the trigger signal 26 and the audio signal 19, the transistor 33 will be driven into either a saturation state or a non-conduction state, resulting in a series of pulses which contain the audio amplitude information. For instance, it can be seen from FIGURE 3 that for high level audio signals, the audio signal will exceed the trigger input for larger periods of time resulting in larger pulses, while for smaller audio signals the audio signal will exceed the trigger signal for smaller periods of time resulting in smaller or narrower pulses.

The pulse modulated audio signal is received at the junction point 63 and is connected through a Zener diode 64 to a control grid 65 of an amplifier tube 66. The tube 66 has a plate connection 67, a grounded cathode 68, a suppressor grid 69 connected directly to the cathode 68, and a screen grid 70 maintained at a specified bias level by a Zener diode 71 which is grounded at the emitter 72. The control grid 65 is maintained at its specified negative bias level by a bias voltage applied at a terminal 73 and conducted to the grid at a point 74 through a grid resistor 75.

Two further amplification stages are required for amplifying the pulse modulated audio signal. First, the output of the tube 66 at the plate 67 is connected through first and second Zener diodes 76 and 77 directly to a control grid 78 of an amplifier tube 79.

The tube 79 has a plate 80 and a cathode 81 and a cathode connected suppressor grid 82. The control grid is maintained at a bias level relative to the cathode 81 by oppositely connected diodes 83 and 84 serially disposed between the grid 78 and the cathode 81. A screen grid 85 is connected between the Zener diodes 76 and 77 at the junction point 86 for maintaining a specified screen voltage. A grid leak resistor 87 and capacitor 88 are connected from the control grid 78 at a point 89 to ground potential as at the point 90. A capacitor 91 is used to aid in coupling the signal from the plate of the tube 66 to the grid of the tube 79.

The power supply for the amplifier tube 79 is connected at a point 93 and conducts directly to the plate 80 of the tube 79 and also conducts through a resistor 94 for supplying the screen grid 70 of the tube 66. A capacitor 95 conducts sudden voltages at the plate 93 to ground potential as at the point 96. As is well understood, the two amplifier tubes 66 and 79 are energized through separate heaters 97 and 98.

A final amplification stage for the pulse modulated audio signal is provided in a power amplifier 99 having a plate 100, a heater cathode 101 and a grid 102. The grid 102 is directly connected to the cathode 81 of the previous amplifier tube 79. The cathode 101 of the tube 99 is also the heater of the tube, and for this purpose the heater circuit 103, consisting of the capacitors 104, 105 and the inductor 106, is provided in a well understood manner.

Because the signal appearing at the grid 102 is a pulse train, the tube 99 will be either in a fully *on* or fully *off* condition. This means that the efficiency of the tube will be greatly increased, as the tube will be called into operation only at the maximum and minimum current levels.

Since the tube 99 is operating only at the maximum and minimum current levels, as determined by the *on* and *off* condition of the pulse train, DC components from the radio frequency stage will not interfere with the tube operation and will not reduce the efficiency thereof. Accordingly, a direct current path is provided from the amplifier tube 99 to the radio frequency stage.

The radio frequency stage 14 of this circuit comprises essentially a high powered amplifier tube 107 having a plate 108, a cathode 109 and a grid 110. A high frequency radio signal is applied to the grid 110 and the audio signal is applied to the cathode 109 resulting in a modulated high frequency signal at the plate 108.

The signal at the plate 100 is filtered through a low pass filter 13 consisting of first and second inductors 111 and 112 and a capacitor 113. The capacitor 113 is connected from a midpoint 114 of the conductors 111 and 112 to ground at a point indicated by the numeral 115.

The filter circuit 13 recovers the audio signal from the train pulse which contains the audio information and the demodulated audio signal is then applied directly to the cathode 109 of the tube 107 at a junction point 116. The cathode and heater of the tube 107 are identical and are energized by a circuit similar to the circuit 103 and consists of the capacitors 117, 118 and the inductor 119, as is well understood. It may be noted that a diode 120 is connected from the plate 100 of the tube 99 to a point in the plate circuit of the plate 108 associated with the amplifier tube 107. The diode 120 keeps sudden high voltage levels from interfering with the operation of the plate 100 of the amplifier tube 99.

In the operation of this circuit, it has been found that stray capacitance between the plate 100 and the cathode 101 of the amplifier tube 99 produces some distortion of the pulse modulated audio wave. This distortion essentially occurs for narrow pulse widths which occur at the extreme swings of the audio signal. The effect of the stray capacitance between the plate 100 and the cathode 101 tends to increase the area of the narrow pulses which results in distortion when the pulse train is recovered in the low pass filter 13.

To eliminate the undesirable effects of the distortion caused by the stray capacitance between the plate and cathode 100 and 101, respectively, of the amplifier tube 99, means have been provided to predistort the small width pulse signals representing the audio information. This predistortion or compensation is accomplished by amplitude modulating the pulse modulated audio signal. An amplitude modulated, pulse modulated audio signal is shown generally in FIGURE 4 and consists of a pulse train 121 which consists of pulses 122 through 127. The pulses have decreasing widths, indicating a decreasing audio signal. The pulse train 121, in particular, is intended to represent a pulse modulation of a portion of a sinusoidal wave. In addition to the pulse modulation, however, the amplitude of the individual pulses has been modified according to the sinusoidal waveform which the pulse train represents. That is, the audio signal which is pulse modulated is used to amplitude modulate the pulse modulated signal.

The amplitude modulation of the pulse train in the circuit of FIGURE 1 is accomplished through a filter connected to the plate 67 of the amplifier tube 66. The filter comprises an inductor 128 and a capacitor 129. The inductor 128 has a resistance 130 connected in parallel therewith, and the parallel combination is serially connected with a power supply 131 for the tube 66. The capacitor 129 is grounded from a junction point 132 intermediate the inductor 128 and a resistor 133, which is connected directly to the plate 67 of the tube 66. Accordingly, the output of the tube 66 is an amplitude modulated, pulse modulation of the audio input signal.

Figure 4:
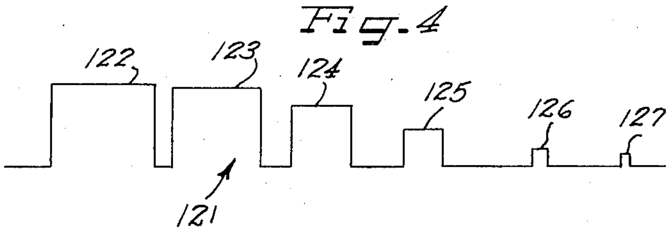
FIGURE 4 is a diagrammatic illustration of an amplitude modulated, pulse modulated audio signal.

The amplitude modulated pulse train is further amplified by the tube 79 and is received at the grid 102 of the tube 99. The value of the pulse amplitude as amplitude modulated in FIGURE 4 is calculated to drive the amplifier tube 99 into saturation for the larger duration pulses only. This means that the larger pulses will be limited to a specific amplitude as determined by the tube saturation characteristic. However, the small amplitude pulses will be unaffected by the saturation as they will not have sufficient amplitude to reach the saturation level.

Figure 5:
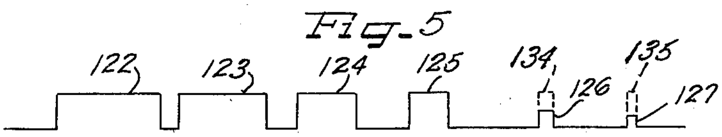
FIGURE 5 is a view similar to FIGURE 4 after the amplitude modulated signal has been limited due to the saturation effect of a power amplifier tube.

The output of the tube 100 and the effect of the saturation thereof is shown in FIGURE 5 wherein the pulses 122 through 125 have a common amplitude due to the limiting effect of the saturation operation of the amplifier 99. However, the pulses 126 and 127 have amplitudes below the limiting amplitude of the pulses 122 through 125 and accordingly have been unaffected by the saturation operation of the tube 99.

Figure 6:
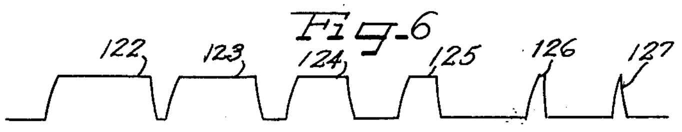
FIGURE 6 is a diagrammatic illustration showing the effect of stray capacitance from the plate to the cathode of the high powered amplifier device.

However, the stray capacitance between the plate 100 and the cathode 101 of the tube 99 tends to increase the size of the smaller pulses as indicated by the pulses 126 and 127. Therefore, in FIGURE 6 the pulses 126 and 127 are shown as at the output of the tube 99. In particular, the pulses 122 to 125 have not appreciably changed in area, while the pulses 126 and 127 have been increased in area to effectively equal the proper area for representing the relative level of the audio signal. The proper level of the pulses 126 and 127 is shown in FIGURE 5 by the dotted pulses 134 and 135. Since the fidelity of the recovered audio signal is determined by the relative proportioned areas of the individual pulses, the distortion developed by the stray capacitance of the amplifier tube 99 has been substantially eliminated by the compensating effect of the amplitude modulating circuit associated with the amplifier tube 66 and by the saturation effect of the amplifier tube 99.

It will be understood that this invention includes RF transmitters with varying power ratings used as AM and FM broadcast equipment, TV, and communication transmitting equipment operating within the relevant assigned frequency spectra. The term RF or radio frequency refers to the entire broadcast spectrum.

It will also be understood that various modifications and combinations of the particular features associated with this invention may be accomplished by those versed in the art, but I desire to claim all such modifications and combinations as properly come within the scope and spirit of my contribution to the art.

I claim as my invention:

1. A high efficiency transmitter comprising:
input means for receiving an audio signal from an audio source;
pulse duration modulator means connected to said input means for pulse duration modulating the audio signal;
amplifier means for increasing the magnitude of the pulse duration modulated signal;
demodulation means for demodulating the amplified pulse duration modulated signal;
a radio frequency modulator means for being connected to a radio frequency source;
connection means for applying the amplified demodulated audio signal to the radio frequency modulator means for modulating a high frequency carrier signal including a D-C current path connected from the radio frequency modulator means to the amplifier means.

2. A radio frequency transmitter comprising:
a pulse duration modulation means for pulse duration modulating an audio signal,
amplifier means for amplifying the resulting pulse duration modulated audio signal,
a radio frequency modulator stage for being connected to a high frequency source,
means connecting the pulse modulation amplifier output to the radio frequency modulator stage,
said means including a D-C path and said means including a pulse demodulator for recovering the original audio signal and for applying the original audio signal to the radio frequency modulator stage.

3. In a radio frequency transmitter, a pulse duration modulator for modulating an audio input, an amplifier stage for amplifying the pulse modulated audio input, a demodulator stage for recovering an amplified audio signal, and a D-C connection from said amplifier stage through said demodulator stage to an RF modulated and broadcast stage.

4. A radio frequency transmitter comprising:
a trigger circuit for pulse modulating an audio input signal:
said trigger circuit having first and second input means for receiving an audio input and a substantially triangular-shaped trigger input respectively;
means for applying a substantial square wave signal to a substantially triangular-shaped trigger input signal for providing a modified triangular trigger signal;
whereby hysteresis in said trigger circuit is compensated by said square wave signal;
said modified triangular and audio input being compared by said trigger circuit for pulse modulating the audio signal;
amplifier means for increasing the gain of the pulse modulated audio signal; and
recovery means for demodulating the audio signal and for applying that signal to an RF modulated output stage.

5. A radio frequency transmitter in accordance with claim 4 wherein a substantially triangular trigger input signal is applied to said second input means, and first and second diodes are connected in an opposite polarity parallel relationship, and wherein said parallel diode combination is connected in series with said second input means for adding a low level substantially square wave signal to the substantially triangular input signal to compensate for cut-off delay of said trigger circuit.

6. A high frequency transmitter comprising:
a trigger circuit for pulse modulating an audio input signal;
said trigger circuit having first and second input means for receiving an audio input and a substantially triangular-shaped trigger input respectively;
means for modifying the triangular input for having a spiked effect at the triangular peaks;
whereby cut-off delay of said trigger circuit is compensated by said spiked configuration;
said modified triangular wave being used to trigger a pulse train in response to the level of an audio input;
whereby said audio signal is pulse modulated;
amplifier means for increasing the gain of the pulse modulated audio signal; and
recovery means for demodulating the audio signal and for applying that signal to an RF modulated output stage.

7. A high frequency transmitter in accordance with claim 6 wherein a capacitor is series connected with said second input means, a square wave signal is integrated across said capacitor for providing said substantially triangular trigger input signal and wherein said modifying means comprises a parallel oppositely poled diode combination in series connection with said capacitor.

8. In a radio frequency transmitter, the method of amplifying a low level audio input comprising:
pulse duration modulating the low level audio signal, amplitude modulating the pulse modulated audio signal, applying the resulting signal to an amplifier tube, driving the amplifier tube into saturation and limiting thereby the amplitude of larger amplitude modulated pulse signals and amplifying without limiting the amplitude of smaller pulse signals, whereby the effect of stray capacitance on smaller pulse signals may be substantially compensated, and,
demodulating the amplified amplitude modulated pulse modulated audio signal to recover an amplified audio signal.

9. A radio frequency transmitter comprising:
first modulator means for pulse modulating an audio input signal;
second modulator means for amplitude modulating the pulse modulated audio input signal in accordance with the modulated audio signal;
amplifier means for increasing the level of the pulse modulated amplitude modulated signal;
demodulator means for recovering an amplified audio signal from the pulse modulated, amplitude modulated signal; and
third modulator means for amplitude modulating a high frequency carrier signal in accordance with the demodulated amplified audio signal.

10. A radio frequency transmitter in accordance with claim 9 wherein a D-C connection is provided between said amplifier means and said third modulator means.

11. A radio frequency transmitter in accordance with claim 10 wherein said second modulator means comprises an amplifier device carrying the pulse modulated audio signal, and an inductance means connected in the plate circuit of the amplifier device.

12. A radio frequency transmitter in accordance with claim 10 wherein said second modulator means comprises an amplifier device carrying the pulse modulated audio signal and a low pass filter connected in series with the plate circuit of said amplifier device.

13. In a radio frequency power transmitter, the combination of:

a pulse modulating means for modulating an audio input, amplitude modulation means for modulating the pulse modulated signal thereby compensating for the effect of stray capacitance in the high powered amplifier means, high powered amplifier means for increasing the level of the amplitude modulated signal, said amplifier means having a plate circuit, a high frequency broadcast stage, an inductance series connected between the plate circuit of the amplifier means and the high frequency stage, and a capacitor connected to said inductance and comprising a low pass filter for recovering the audio signal from the modulation pulse train.

14. In a radio frequency power transmitter, the combination of:

a pulse modulating means for modulating an audio input, said pulse modulating means including a trigger circuit energized by a triangular input signal wherein said input signal is modified by a square wave pulse to compensate for cut-off delay of said trigger circuit, amplitude modulation means for modulating the pulse modulated signal thereby compensating for the effect of stray capacitance in the high powered amplifier means, high powered amplifier means for increasing the level of the pulse modulated signal, said amplifier means having a plate circuit, a high frequency broadcast stage, an inductance series connected betwen the plate circuit of the amplifier means and the high frequency stage, and a capacitor connected to said inductance and comprising a low pass filter for recovering the audio signal from the modulation pulse train.

15. A radio frequency transmitter comprising:

a pulse duration modulation means for pulse duration modulating an audio signal, pulse amplifier means for amplifying the resulting pulse duration modulating audio signal, a radio frequency modulator stage for being connected to a high frequency source, demodulation means for recovering the original audio signal from the pulse duration modulated signal, and a D-C coupling path connected from the pulse amplifier means through the demodulation means to the radio frequency modulator stage for modulating a high frequency carrier signal.

References Cited

UNITED STATES PATENTS

| | | | |
|---|---|---|---|
| 2,227,596 | 1/1941 | Luck | 325—142 |
| 2,263,276 | 11/1941 | Pulley | 332—61 |
| 2,338,512 | 1/1944 | Harmon | 325—181 X |
| 2,990,516 | 6/1961 | Johannessen | 332—15 X |
| 3,167,720 | 1/1965 | Sharma | 332—15 X |
| 3,336,538 | 8/1967 | Crowhurst | 325—142 X |
| 3,363,199 | 1/1968 | Besslich | 325—142 X |
| 3,366,882 | 1/1968 | Briley | 325—38 |
| 3,384,838 | 5/1968 | Knutrud | 325—142 X |
| 3,348,151 | 10/1967 | Holmes | 325—182 |

OTHER REFERENCES

Philco Corporation Application Labor Report 610A, "A 30-Milliwatt Transistorized Radiophone Transmitter."

ROBERT L. GRIFFIN, Primary Examiner

J. A. BRODSKY, Assistant Examiner

U.S. Cl. X.R.

325—182; 332—15, 41